United States Patent
Dahlbäck et al.

(10) Patent No.: US 6,757,527 B1
(45) Date of Patent: Jun. 29, 2004

(54) METHOD AND APPARATUS FOR SYNCHRONIZING A LOCAL REFERENCE FREQUENCY IN A COMMUNICATION SYSTEMS

(75) Inventors: Erik Dahlbäck, Veberod (SE); Roozbeh Atarius, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 395 days.

(21) Appl. No.: 09/662,546

(22) Filed: Sep. 15, 2000

(30) Foreign Application Priority Data

Sep. 16, 1999 (GB) .............................................. 9921978

(51) Int. Cl.[7] ................................................ H04B 1/06
(52) U.S. Cl. ................. 455/255; 455/67.11; 455/196.1; 331/176
(58) Field of Search ................................ 455/255–259, 455/265, 191.1, 192.2, 67.11, 115.1, 196.1, 226.1; 331/175, 176, 34, 66

(56) References Cited

U.S. PATENT DOCUMENTS

| | | | | |
|---|---|---|---|---|
| 4,921,467 A | * | 5/1990 | Lax | 455/264 |
| 5,579,338 A | | 11/1996 | Kojima | |
| 5,856,766 A | | 1/1999 | Gillig et al. | |
| 6,278,867 B1 | * | 8/2001 | Northcutt et al. | 455/255 |
| 6,476,682 B1 | * | 11/2002 | Cole et al. | 331/176 |

FOREIGN PATENT DOCUMENTS

| | | |
|---|---|---|
| EP | 0 858 196 | 8/1998 |
| WO | 96/24986 | 8/1996 |

* cited by examiner

*Primary Examiner*—Quochien B. Vuong
(74) *Attorney, Agent, or Firm*—Burns, Doane, Swecker & Mathis, L.L.P.

(57) ABSTRACT

A method for synchronizing a local reference frequency in a mobile station includes measuring a current ambient condition of the mobile station and using stored data indicating variance of the local reference frequency with known ambient conditions to determine the method by which the local reference frequency is synchronized.

8 Claims, 3 Drawing Sheets

METHOD AND APPARATUS FOR SYNCHRONIZING A LOCAL REFERENCE FREQUENCY IN A COMMUNICATION SYSTEMS

This application claims priority under 35 U.S.C. §§119 and/or 365 to 9921978.4 filed in the United Kingdom on Sep. 16, 1999; the entire content of which is hereby incorporated by reference.

The present invention relates to communication systems and in particular to radio frequency communication systems in which mobile stations communicate with base stations.

BACKGROUND OF THE INVENTION

In a communication system including base stations and mobile stations which communicate with the base stations, the mobile stations include reference oscillators which are used to decode received transmissions from base stations and to transmit signals to the base stations. The mobile station reference oscillator provides a local frequency to the mobile station which, in theory, should be synchronised with and equal to the network frequency. However, due to inaccuracies in the crystal oscillators usually used in mobile stations, it is necessary for the mobile station to adjust its local frequency so that it is synchronised with the network frequency. Conventionally, complex algorithms are used which can operate only with high signal to noise ratios of the input network signal. The main cause of oscillator instability is temperature change and so temperature compensated high accuracy crystal oscillators can be provided. However, such a solution is considered to be expensive.

In addition to initial frequency synchronisation, a synchronised mobile station must update its local frequency to the network frequency because of the variance of local reference frequency with temperature.

Whilst the mobile station is in an active mode and is communicating with the base station, the mobile station has constant access to frequency and time reference information from the network, and can use this to make the required adjustments to local frequency. However, when a mobile station is in an idle mode, access to network information is limited. In an idle mode, the mobile station will occasionally be activated in order to receive paging signals from the network. In order to preserve battery power, the mobile station must only become active for a short amount of time. It is therefore necessary that the frequency and time reference estimation is carried out in a short amount of time. However, large estimation errors can occur when large variations of frequencies combine with low signal to noise ratios and short estimation periods.

In the proposed IMT 2000 system based on a wide band code division multiple access (W-CDMA) system-time boundary reference synchronization is required. Synchronizing to a time reference is dependent upon the accuracy of the local crystal frequency, and so a mobile station initially synchronises to the network by looking for a symbol, the so-called long code mask symbol (LCMS) which is transmitted in the broadcast channel (BCCH). The received signal is filtered by matched filters and peaks in the output of those filters provide the location of the LCMS. However, if the local oscillator crystal is inaccurate, for example ±10 ppm, the frequency deviation between the local crystal and the reference can be up to plus or minus 20 kHz. This is due to the carrier frequency being 2 GHz. Since the symbol rate in the BCCH is 16 kHz the symbol rotates 450° (360°×10 ppm×2 GHz/16 kHz) within the symbol duration. Such large rotation results in severe loss of the signal energy at the peaks of the matched filters output. Thus, the LCMS is divided to a number of sequences, for example 4, which are searched separately and the results of the match filters are non-coherently summed. Splitting the LCMS in this way reduces the symbol rotation for that portion of the LCMS. However, dividing the LCMS into four segments can also deteriorate the signal to noise ratio and can cause problems when detecting the full LCMS. The wideband CDMA specification ($3^{rd}$ Generation partnership Project (3 GPP) document TS25.201, V2.1.0) describes this system in more detail.

In an example of frequency synchronization, the global system for mobile communications (GSM) system transmits synchronisation information from base stations to mobile stations in terms of a frequency correction burst (FCB) and synchronisation burst (SB). The FCB consists of a pure sinusoid which needs to be detected, and which a mobile station uses to obtain rough time synchronisation to the network as well as to adjust the local frequency reference. The SB is transmitted 8 bursts after the FCB and so detection of the FCB enables the position of the SB to be determined. The FCB can also be used to provide a coarse adjustment of the reference frequency, while the SB is used for fine adjustment. This method is used in the GSM system, a description of which can be found in "The GSM system for mobile communications", by Mouly and Pautet.

There are a number of algorithms used for initial synchronisation of a mobile station to a GSM network.

Since the FCB is a pure sinusoid, a frequency selective filter is usually used to suppress the noise outside the frequency zone of interest in order to improve the signal to noise ratio. This improvement depends on the bandpass of the filter. The narrower the bandpass, the better the signal to noise ratio. The inaccuracy of the local crystal (for example 10 ppm) however can effect the frequency of the received FCB. This frequency can be interpreted with the deviation of +/−9 KHz if the carrier frequency is 900 MHz. Hence the cut off frequency of the filter should be greater than 9 kHz. In a case of a carrier frequency of 1800 MHz or 1900 MHz, in the GSM 1800 and 1900 systems, the cutoff frequency of the filter would need to increase to 18 or 19 KHz. The limitation of the cut off frequency due to the inaccuracy of the crystal oscillator therefore reduces the improvement of signal to noise ratio and hence reduces the likelihood of fast synchronisation.

It is therefore desirable to provide an apparatus in which synchronisation of the local reference frequency to the network frequency can be achieved quickly and with minimum power consumption.

SUMMARY OF THE INVENTION

According to one aspect of the present invention, there is provided a method for synchronising a local reference frequency in a mobile station, the method including measuring a current ambient condition of the mobile station and using stored data indicating variance of the local reference frequency with known ambient conditions to determine the method by which the local reference frequency is synchronised.

According to another aspect of the present invention, there is provided an apparatus for communicating with a wireless network having a network reference frequency, the apparatus comprising a local oscillator for producing a signal having a local reference frequency, a storage device for storing data indicating the variance of the local reference frequency with changes in a known ambient condition of the apparatus, control means for adjusting the local frequency, and measurement means for measuring the ambient condition of the apparatus and supplying that measurement to the control means, wherein the control means is operable to retrieve data stored in the storage device which is indicated by the received measurement, and to adjust the local reference frequency in accordance with an adjustment method determined by the retrieved data.

DETAILED DESCRIPTION OF THE PREFERRED EMBODIMENTS

Figure 1:
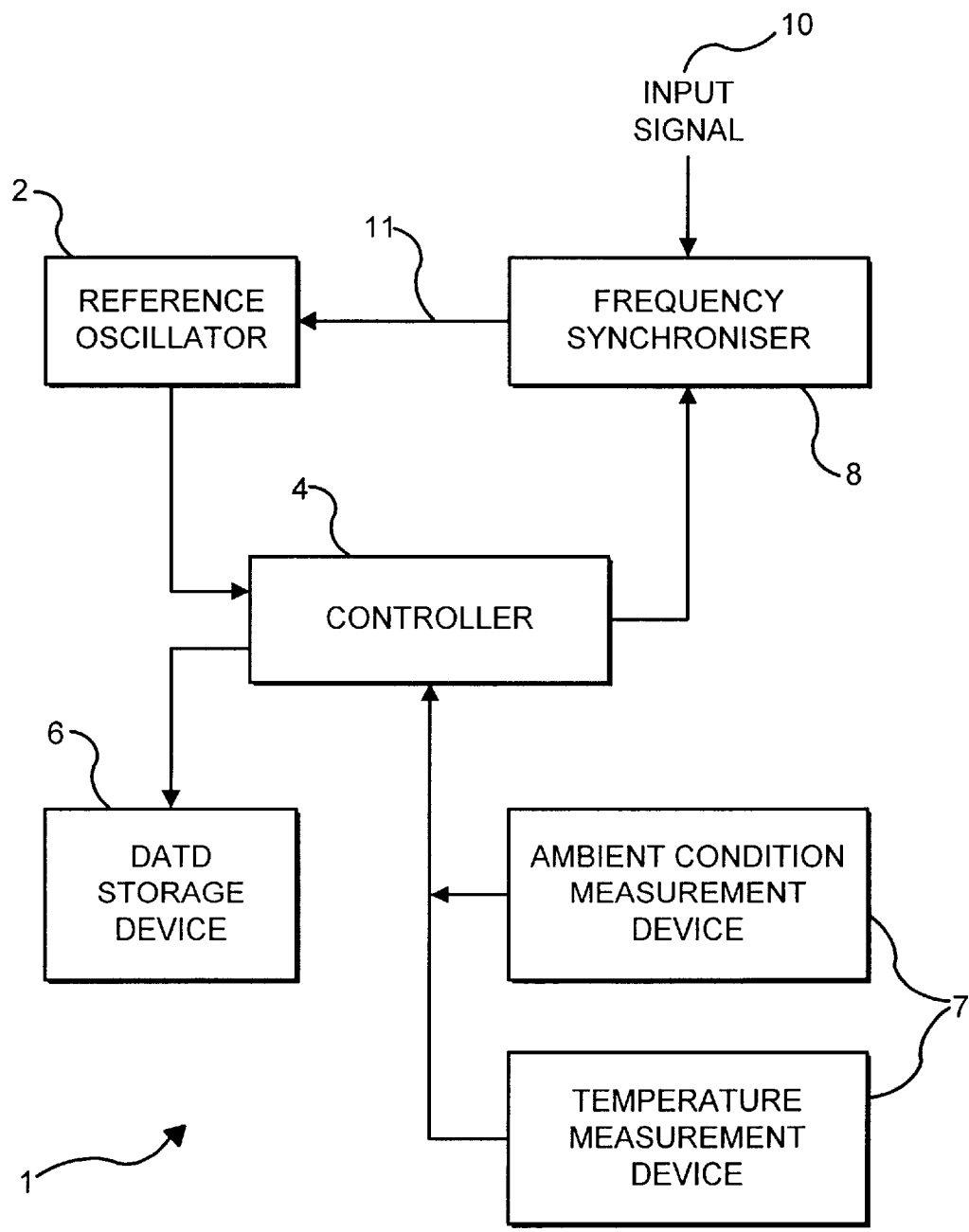
FIG. 1 is a block diagram illustrating a mobile station operable in accordance with one aspect of the present invention.

FIG. 1 is a block diagram illustrating a mobile station 1 operable in accordance with the present invention. The mobile station 1 includes a reference oscillator 2, a controller 4 and a frequency synchroniser 8. The frequency synchroniser receives an input signal 10 from the network and, under the control of the controller 4, adjusts the reference oscillator by way of an output signal 11. In this way, the controller 4 is able to adjust the reference oscillator frequency so as to synchronise with the network input signal 10.

The mobile station 1 also includes a reference oscillator data storage unit 6 and a temperature measurement device 7. The data storage unit 6 is used to store calibration data relating to the known inaccuracies of the reference oscillator over a range temperatures. The measurements are preferably updated in order to reduce the statistical uncertainties of the stored data. The stored information can be updated whenever reference information is available from the network. In this way, the crystal oscillator can be self-calibrating.

The controller 4 receives temperature information from the temperature measurement device 7. The controller uses the temperature information to refer to the calibration data stored in the data storage unit 6 in order to obtain data indicating the actual variance of the frequency of the local oscillator. The controller 4 can then modify the algorithms for the initial and maintenance of the frequency and/or time reference synchronisation to the network frequency/time reference on the basis of the calibration information. This modification allows the mobile station 1 to operate at lower signal to noise ratios, or use a less complex algorithm, or be able to verify an estimate produced by an existing algorithm.

Thus, a method embodying the present invention enables the mobile station to determine how far the reference oscillator must be compensated to synchronise with the network frequency. For example, if the stored data indicates that the crystal is likely to be severely inaccurate, then a more complex and robust algorithm should be used for the frequency correction. However, if the stored data indicates that the crystal is varying only a small amount from the required frequency, then a simplified, and hence faster, algorithm can be used.

Figure 2:
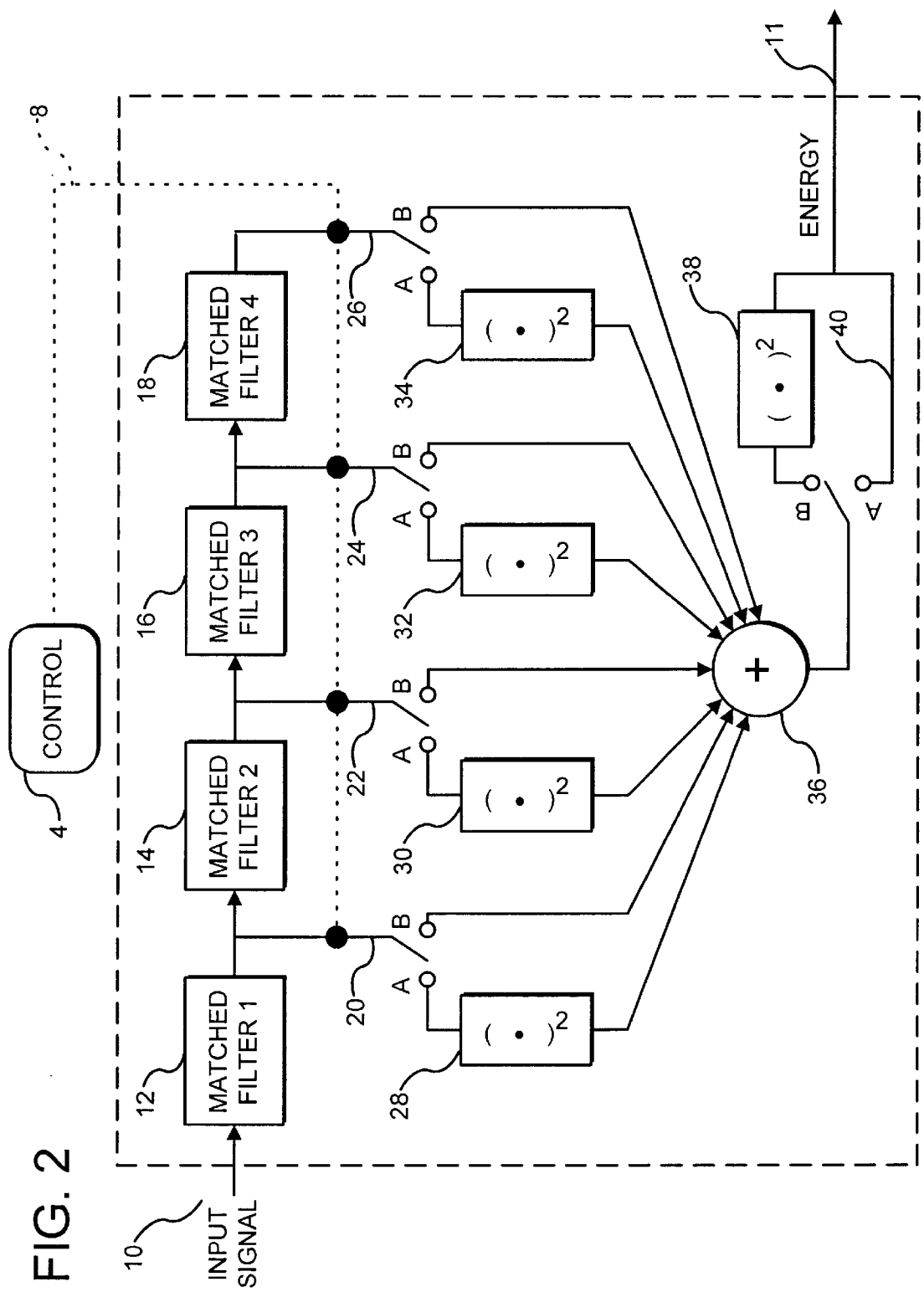
FIG. 2 illustrates in more detail a first frequency synchroniser of the mobile station in FIG. 1.

With the wideband code division multiple access W-CDMA system described above the use of stored reference oscillator calibration data can produce reduced inaccuracy and the detection of the partial LCMS can be substituted by detection of the entire LCMS in order to reduce potential symbol rotation. A suitable system for W-CDMA applications is shown in FIG. 2. The frequency synchroniser 8 comprises a series of matched filters 12, 14, 16 and 18 each of which produces a respective output. The controller 4 operates to switch the outputs of the matched filters, using respective switches 20, 22, 24 and 26, between non-coherent averaging and coherent averaging. For non-coherent averaging, the signals are squared by multipliers 28, 30, 32 and 34, the squared signals added by an adder 36 and the result output as a control signal 11. In the non-coherent averaging technique, the output is simply transferred directly to obtain the time boundaries. For coherent averaging, the sum of the output signals of the matched filters are summed by the adder 36 and the result squared before output as a control signal.

The switching between coherent and non-coherent averaging is dependent upon the accuracy of the oscillator. For example, if the accuracy is 10 ppm which is outside a desired preselected range of variance, then the switches 20, 22, 24 and 26 are set to position A for non-coherent averaging. However, when the oscillator is within the preselected range, i.e. it is within the range of calibration data stored in the data storage unit, the switches are shifted to position B to provide coherent averaging. In this way, the frequency synthesiser can provide an appropriate control signal dependent upon the actual variance of the oscillator.

Figure 3:
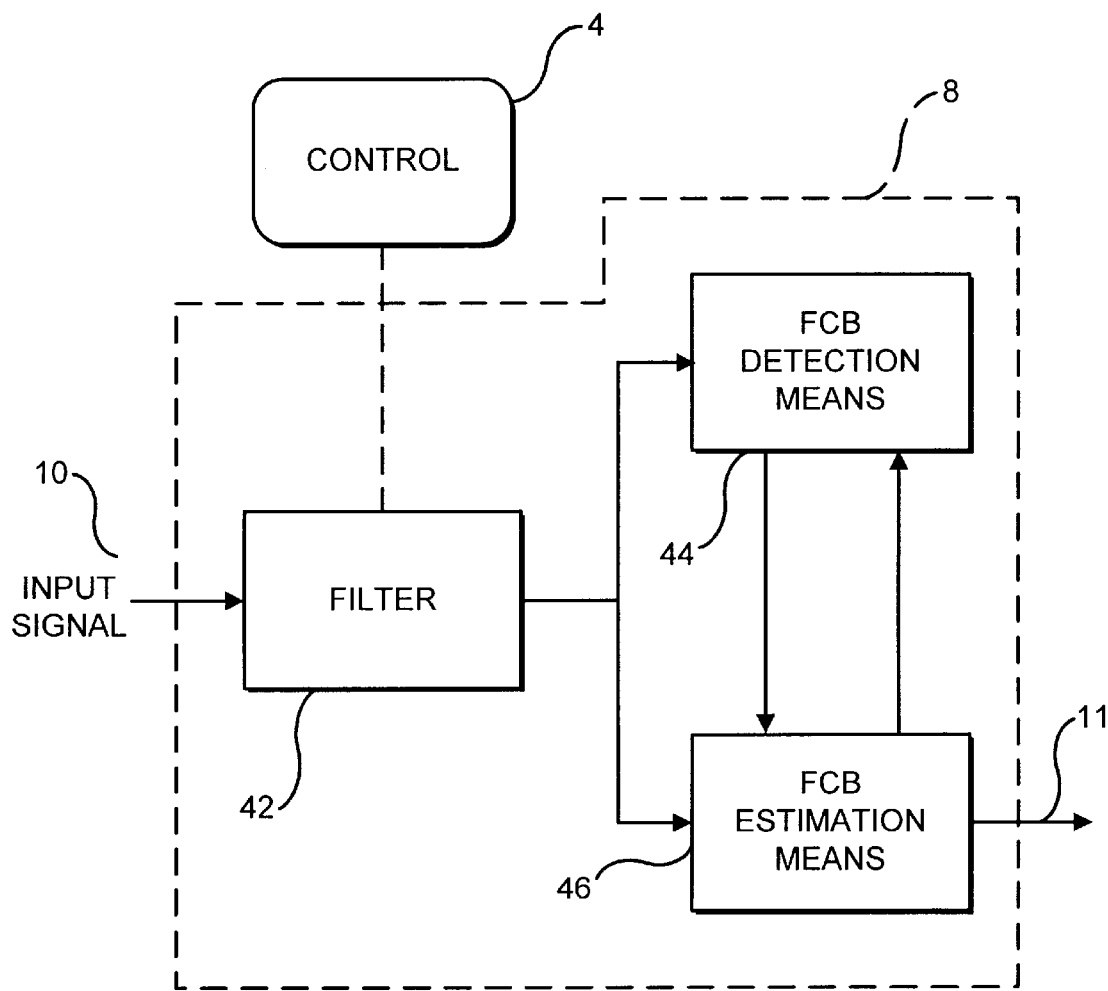
FIG. 3 illustrates in more detail a second frequency synchroniser for use in the mobile station of FIG. 1.

For frequency synchronization, for example in the GSM system as described above, a mobile station includes a frequency synchroniser as shown in FIG. 3. The synchroniser includes a filter 42 having a controllable cutoff frequency in order to enhance the signal to noise ratio of the device. An FCB detection unit 44 and an FCB estimation unit 46 receive the filter output and operate to provide a control signal for the reference oscillator. When the controller 4 determines, for example by measuring the temperature, that the reference oscillator is within a certain frequency range from the specification value, the cutoff frequency of the filter 42 can be reduced. By reducing the cutoff frequency of the filter 42, the signal-to-noise ratio of the system can be improved. If the oscillator is outside of the range, then the cutoff frequency can be increased.

A mobile station which is not active will usually preserve battery power by entering an idle mode. In an idle mode, the mobile station operates for a small percentage of time in order to determine whether or not it has been paged. During this limited time the mobile station must estimate the network reference frequency and compare it to its own local frequency. Such a frequency adjustment is required since the frequency of the local oscillator will move away from the reference frequency of the network. Using the oscillator calibration system of the present invention, the estimates of network frequency can be evaluated and compared against the stored data in order to determine how far from the desired value is the oscillator frequency.

What is claimed is:

1. A method for synchronising a local reference frequency in a mobile station, the method including storing data indicative of the variance of the local reference frequency with known ambient conditions, measuring a current ambient condition of the mobile station and using the stored data to determine a method by which the local reference frequency is synchronised.

2. A method as claimed in claim 1, wherein the measured current ambient condition is used to retrieve data stored in a storage device in the mobile station, which data relates to the variance of local reference frequency of the mobile station over a range of known ambient conditions, the method further comprising comparing the retrieved data with a predetermined value range, and if the retrieved data is outside the predetermined value range, synchronising the local reference frequency using a first method, or if the retrieved data is inside the predetermined value range, synchronising the local reference frequency using a second method.

3. A method as claimed in claim 2, wherein the local reference frequency is synchronised to a wide band co-division multiple access network reference frequency and wherein the first method is a non-coherent averaging method and the second method is a coherent averaging method.

4. A method as claimed in claim 2, wherein the local reference frequency is synchronised to a GSM network reference frequency, and wherein the first method includes filtering an input network signal with a filter having a first bandpass width, and the second method includes filtering an input network signal with a filter having a second bandpass width, the second bandpass width being smaller than the first bandpass width.

5. An apparatus for communicating with a wireless network having a network reference frequency, the apparatus comprising a local oscillator for producing a signal having a local reference frequency, a storage device for storing data indicative of the variance of the local reference frequency with known ambient conditions of the apparatus, control means for adjusting the local frequency, and measurement means for measuring a current ambient condition of the apparatus to produce a current ambient condition measurement and for supplying the current ambient condition measurement to the control means, wherein the control means is operable to retrieve data stored in the storage device which data corresponds to the current ambient condition measurement, and to adjust the local reference frequency in accordance with an adjustment method determined by the retrieved data.

6. An apparatus as claimed in claim 5, wherein the control means comprises first and second adjustment means, and is operable to select the first adjustment means if the retrieved data is outside a predetermined range of values, and to select the second adjustment means if the retrieved data is within the predetermined range of values, the first and second adjustment means being operable to adjust the local reference frequency in accordance with respective methods.

7. An apparatus as claimed in claim 6, for use in a wideband code division access communications system, further comprising a series of four matched filters, each filter except the first receiving as its input the output of the previous filter in the series, the first filter in the series receiving a network reference frequency signal as its input, each filter providing a respective output, wherein the first adjustment means is operable to produce a non-coherent average signal from the outputs of the matched filters, and the second adjustment means is operable to produce a coherent averaged output of the filter outputs.

8. An apparatus as claimed in claim 6, for use in a GSM communications network, wherein the first adjustment means includes a first filter connected to receive an input network signal, the first filter having a first bandpass width, and the second adjustment means includes a second filter connected to receive an input network signal, the second filter having a second bandpass width which is smaller than the first bandpass width, and wherein the outputs of the first and second filters are connected to a GSM frequency correction burst estimator and detector means.

* * * * *